United States Patent [19]

Yamada et al.

[11] Patent Number: 4,665,325
[45] Date of Patent: May 12, 1987

[54] SOLID STATE IMAGE SENSOR WITH SIGNAL AMPLIFICATION

[75] Inventors: Takahiro Yamada; Yoshihiro Fujiwara, both of Hirakata, Japan

[73] Assignee: Matsushita Electric Industrial Co., Ltd., Kadoma, Japan

[21] Appl. No.: 695,222

[22] Filed: Jan. 25, 1985

[30] Foreign Application Priority Data

Jan. 30, 1984 [JP] Japan ................................ 59-16329
Jan. 30, 1984 [JP] Japan ................................ 59-16330

[51] Int. Cl.$^4$ .................... H03K 3/42; H01L 29/78; H01L 27/14; H01L 31/00
[52] U.S. Cl. .................................. 307/311; 357/24; 357/30
[58] Field of Search .................. 357/24, 30; 307/311

[56] References Cited

U.S. PATENT DOCUMENTS

| | | | |
|---|---|---|---|
| 4,155,094 | 5/1979 | Ohba et al. | 357/24 LR |
| 4,300,151 | 11/1981 | Nishizawa | 357/22 |
| 4,450,464 | 5/1984 | Yamada | 357/24 LR |
| 4,524,391 | 6/1985 | Nishizawa et al. | 357/24 LR |
| 4,525,742 | 6/1985 | Nishizawa et al. | 357/24 LR |
| 4,556,909 | 12/1985 | Yamada | 357/24 LR |
| 4,562,474 | 12/1985 | Nishizawa | 357/30 |
| 4,571,624 | 2/1986 | Nishizawa et al. | 357/24 LR |

OTHER PUBLICATIONS

Nishizawa et al, "SIT Image Converter", vol. 8, Semiconductor Technologies (1983), pp. 219-242.
Nishizawa et al, "Field-Effect Transistor Versus Analog Transistor (Static Induction Transistor)", IEEE vol. ED-22, No. 4 (1975), pp. 185-197.
Nishizawa et al, "Static Induction Transistor Image Sensors", IEEE vol. ED-26, No. 12 (1979), pp. 1970-1977.
Ohmi et al, "Non-Destructive Image Sensor", IEDM (1980), pp. 350-354.
Chamberlain, "High Speed Scanner Photoelement with Gain", *IBM Tech. Disclosure Bulletin*, vol. 19 (4/77) pp. 4458-4460.

Primary Examiner—Gene M. Munson
Attorney, Agent, or Firm—Cushman, Darby & Cushman

[57] ABSTRACT

A solid state image sensor has vertical BCCD, semiconductor substrate and photoelectric transducer formed in thickness direction of the semiconductor substrate by comprising SIT (static induction transistor), wherein holes generated by incident light are stored in the photoelectric transducing part, and electrons of a number as many as m-times of the number of the stored holes are read out from the semiconductor substrate to the vertical BCCD, and thus sensitivity multiplication is obtained.

6 Claims, 17 Drawing Figures

SOLID STATE IMAGE SENSOR WITH SIGNAL AMPLIFICATION

BACKGROUND OF THE INVENTION

1. Field of the Invention

The present invention relates generally to a solid state image sensor. The present invention particularly concerns a solid state image sensor having a high S/N ratio and wide dynamic range.

2. Description of the Prior Art

Conventional solid state image sensors can be generally classified into X-Y addressing MOS type image sensors (hereinafter referred to as MOS type) and charge transfer type CCD image sensors (hereinafter referred to as CCD type). It is known that among the above-mentioned two types, the latter-mentioned CCD type is 2-3 times advantageous in sensitivity than the MOS type. This is because, in the CCD type, especially in the interline type which is the representative type, a high S/N ratio is obtainable by decreasing detection capacitances charge detectors built in on-chip in the image sensor. However, as far as this CCD type image sensor is used, even when utmost care is made in decreasing internal noise of the device to improve the S/N ratio, as a result of shot noise theoretically induced by the incident light the S/N ratio of light signal as such has a limit. Therefore, this CCD type is not necessarily absolutely advantageous in achieving high sensitivity. And furthermore, the shot noise due to the input light signal becomes prominent as the degree of integration of devices advances more. Furthermore, in the CCD type device, since BCCD (buried-channel CCD), which is advantageous in transfer efficiency and smallness of noise for vertical transfer parts, is generally utilized, maximum transfer charge can not be made large. And this becomes more problematic when the device is further miniaturized. Furthermore, because of wideness of depletion region and having residual dark current in BCCD even after reading out from photodiodes to the BCCD, undesirable influence of increase of dark current depending on temperature rise is considerable. Accordingly FPN (fixed pattern noise) induced by dispersion of the dark current increases, thereby lowering S/N ratio and the dynamic range.

Another type of solid state image sensor utilizing SIT (static induction transistor) which was reported in the Japan Annual Review in Electronics, *Computers and Telecommunications*, vol. 8, "Semiconductor Technology" (1983), p. 219-242, has a high sensitivity amplification function. In order to take good advantage of the high sensitivity characteristic of the SIT image sensor, a configuration of solid state image sensor capable of high S/N ratio, but there has been no reports on such study, so far.

SUMMARY OF THE INVENTION

The primary object of the present invention is to provide a high sensitivity solid state image sensor, which has photoelectric transducing function of charge multiplier type in CCD type solid state image sensor. The solid state image sensor in accordance with the present invention comprises vertical BCCD, semiconductor substrate and photoelectric transducer which are formed in thickness direction of the semiconductor substrate by comprising J-FET's, especially SIT (static induction transistor). In the above-mentioned solid state image sensor, holes or electrons generated by incident light are stored in the photoelectric transducing part, and electrons or holes of a number as many as m-times of the number of the holes or electrons stored in the photoelectric transducing part are read out from the semiconductor substrate to the vertical BCCD, and thus sensitivity multiplication is obtained.

A second object of the present invention is to achieve a wide dynamic range. In other words, by absorbing a part of the holes or electrons generated by the incident light by means of the pixel isolation region having a configuration similar to the photoelectric transducing region, $\gamma$-characteristic of the image sensor can be controlled, and that, by selecting the $\gamma$-value to be $\gamma < 1$, the wide dynamic range in equivalency is realized.

The solid state image sensor in accordance with the present invention comprises:

a semiconductor substrate having a high impurity concentration of a first conductivity type, an epitaxial layer of a low impurity concentration formed on the substrate, a plurality of first regions of high impurity concentration of a second conductivity type formed in a two-dimensional disposition on the epitaxial layer and electrically in a floating state, plural charge transfer means which comprises second regions of the first conductivity type and formed corresponding to respective one row of the first regions and electrically in a floating state, and voltage controlling means for controlling voltage relations between the semiconductor substrate, the first regions and the second regions for forming potential barriers against majority carriers in movable manner of their positions among these parts.

BRIEF DESCRIPTION OF THE DRAWING

FIG. 2(d) and FIG. 2(e) are energy-band diagrams corresponding to the operations of FIG. 2(b) and FIG. 2(c), respectively.

DETAILED DESCRIPTION OF THE PREFERRED EMBODIMENT

Figure 1:
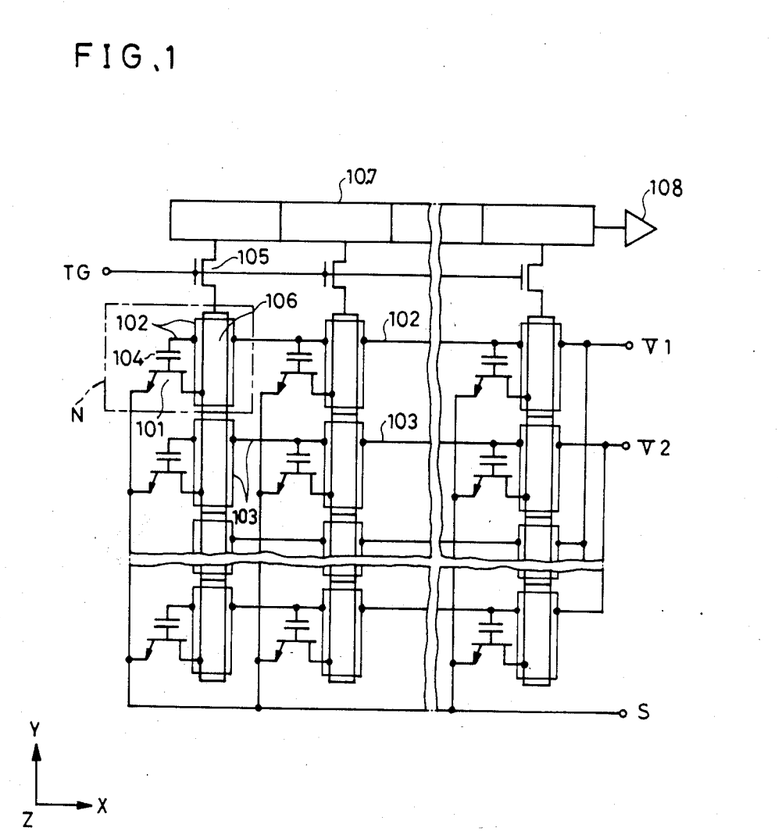
FIG. 1 is a schematic plan view of a solid state image sensor embodying the present invention.

A first embodiment in accordance with the present invention is described with reference to FIG. 1, FIG. 2(a), FIG. 2(b), FIG. 2(c), FIG. 2(d), FIG. 2(e), FIG. 2(f), FIG. 2(g) and FIG. 3. In FIG. 1, which is a schematic plan view of the embodiment, SIT (static induction transistor) type phototransistors 101, comprises transfer gates 102 on which vertical scanning pulses $\Phi_{V1}$ are to be impressed, a gate electrode V1 which is connected to the transfer gates 102, other transfer gates 103 on which vertical scanning pulses $\Phi_{V2}$ is to be impressed, a gate electrode V2 which is connected to the transfer gates 103, coupling capacitors 104 for impressing vertical scanning pulses to gates of SIT phototransistors 101, source electrodes S for impressing voltage in common to sources of SIT phototransistors 101, vertical-horizontal transducing gates 105, a gate electrode TG, vertical BCCD's 106, a charge detection amplifier 108 are provided on one LSI chip.

Figure 2A:
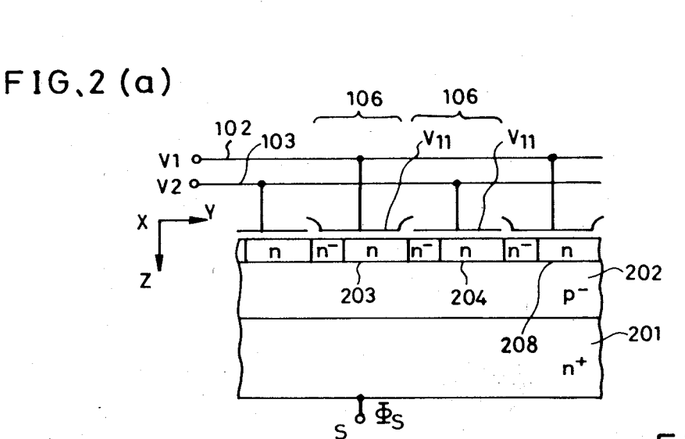
FIG. 2(a) is a sectional elevation view showing a cross-section of a part Q circled by chain lines on FIG. 1, and on k-k' section of FIG. 2(b).
Figure 2B:
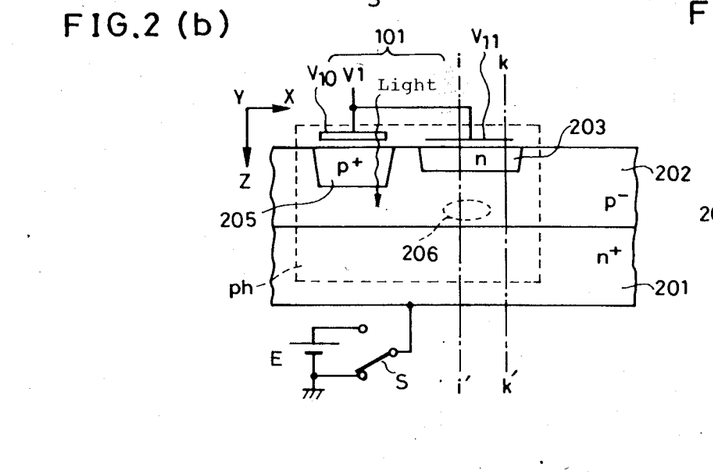
FIG. 2(b) is a cross-sectional view on an X-Z section at multiply-reading of a pixel information.
Figure 2C:
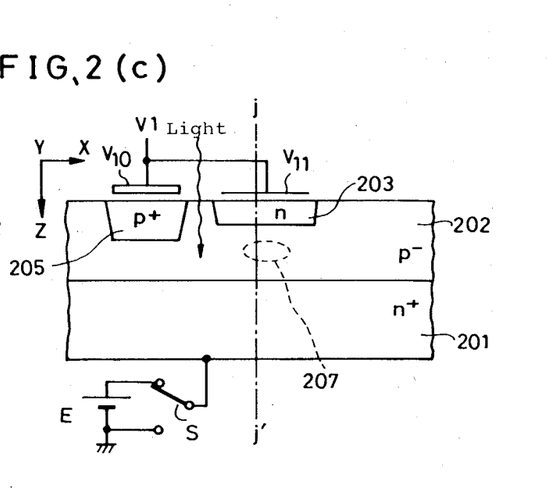
FIG. 2(c) is a cross-sectional view on an X-Z section at charge-transferring of a pixel information.

In the LSI chip of FIG. 1, the part circled by a chain line N has cross-sectional configuration as shown in FIG. 2(a), FIG. 2(b) and FIG. 2(c), wherein left end corresponds to the substrate 201 and right end to the surface part of the vertical BCCD 106. As shown by FIG. 2(a) to FIG. 2(c), on an n+-conductivity type (high impurity concentration) substrate 201, an epitaxial layer 202 of a low impurity concentration is formed by known method. The conductivity of this epitaxial layer is e.g. p−-type, but may be n− or i. In the part N which comprises p+-conductivity type (a high impurity concentration) which works as a gate part of a phototransistor ph, an n-region 203 serves as charge storing part of the vertical BCCD 106, and this region also serves as a drain part of the phototransistor 101. In this phototransistor ph, the n+-conductivity type substrate 201 serves as the source part of the phototransistor 101. A transparent electrode $V_{10}$ is provided over the p+-region 205 in electrically floating relation therefrom. A non-transparent electrode $V_{11}$ is provided over the n-region 203 in electrically floating relation therefrom. Both the transparent electrode $V_{10}$ and the non-transparent electrode $V_{11}$ in a phototransistor ph are connected to one of the electrodes $V_1$, and the transparent electrode $V_{10}$ and the non-transparent electrode $V_{11}$ in the next phototransistor (not shown in FIG. 2(a) or FIG. 2(b)) are connected to the other of the electrodes $V_2$. Thus the electrode $V_1$ and $V_2$ are alternately connected to the electrodes $V_{10}$ and $V_{11}$ in every two phototransistors ph. By impressing a control pulse voltage on the electrode S which is connected to the n+-conductivity substrate 201, the pixel multiplication reading operation, which implies reading out of multiplied signal charge from the n+-substrate 201 to the n-region 203 in the vertical BCCD 106, can be isolated from vertical and horizontal charge transferring operation. This is the important feature of the present invention. The transfer region 203 is of course shielded from the light incident to the phototransistor part ph.

Since the operation of pixel charge multiply-reading can be instantly isolated by impression of the control pulse, the solid state image sensor in accordance with the present invention is named as "charge amplified device in reading moment" (abbreviated as CARM), to smbolize the function of the solid state apparatus of the present invention which realizes pixel charge multiply function at the instant of reading out the signal charge from the photoelectric transducer to vertical BCCD.

Hereafter, configuration and principle of the operation is described with reference to FIG. 1 to FIG. 2(e).

(1). Pixel multiplying reading:

When electrode S connected to the n+-substrate 201 is grounded: (i) When there is no incident light, as shown in FIG. 2(b) a potential barrier region 206 of a saddle type, which is a special feature of SIT is formed on i–i' line, and a potential barrier 206' is formed as shown in FIG. 2(d). (ii) When there is incident light, in the p−-epitaxial region 202, electron and hole pairs are produced, and the electrons are transferred to the n-region 2–3 in the vertical BCCD, and the holes move to the p+-region 205. The holes stored in the p+-region 205 raises the potential of the p+-region 205 by $\Delta\phi$, and thereby the potential barrier against the electrons are increased by $\Delta\phi$. Therefore, a high level part of the vertical transferred pulse $\Phi_{V1}$ is boosted by this $\Delta\phi$ when impressed on the p+-region 205, which is the gate of the phototransistor 101. Thereby, electrons are injected from the n+-substrate 201 through p−-epitaxial region 202 to the n-region 203 corresponding to the rise by $\Delta\phi$. Since the holes stored in the p+-region 205 is kept as they are, when the potential $\Phi_{V1}$ are below a predetermined level a non-destructive reading of the holes can be made. On the contrary, if the voltage $\Phi_{V1}$ is higher than the predetermined level, the positive holes stored in the p+-region 205 is put out to the n+-substrate 201, and in this case the reading is a usual destructive reading. In both cases of the non-destructive reading and the destructive reading, the number of electrons to be injected from the n+-substrate 201 to the n-region 203 in the vertical BCCD 106 is multiplied by the holes stored in the p+-region 205. Such multiplication can be made by selecting the capacitance Cp of the p+-region 205 and capacitance Cn of the n+-substrate 201 to be Cn/Cp=m.

(2). Charge transfer operation:

When a voltage E is impressed on the electrode S connected to the n+-substrate 201: (i) When there is no incident light, as shown in FIG. 2(c) a potential barrier region 207 of a saddle type which is a special feature of SIT is formed on j–j' line, and a potential barrier 207 is formed as shown in FIG. 2(e). The potential barrier 207 is formed closer to the n-region 203 of the vertical BCCD 106 in comparison with the potential barrier 206. (ii) Accordingly, even when light comes on to phototransistor 101, among the electron and hole pairs produced in the p−-epitaxial region 202, the electrons move to the n+-region 201, and the holes move to p+-region 205. Then, the holes stored in the p+-region 205 lower the potential barrier 207 by $\Delta\phi'$, but the holes are only kept stored in the p+-region 205, isolated from transfer operation of the vertical BCCD 106 until commencing of pixel multiply-reading.

(3). Sequence of operation:

In ($t_1$–$t_2$) period:

In this period, the voltage $\Phi_S$ being impressed on the electrode S connected to the n+-substrate 201 becomes to low level, and the potential of n+-substrate 201 of FIG. 2(d) shifts to $\phi_3$. From that instant, a state of energy band structure of FIG. 2 wherein pixel multiply-reading becomes possible. In this case, the potential barrier 206 shifts from the potential $\phi_1$ at non-illuminated state the potential $\phi_2$ at illuminated state by $\Delta\phi$.

In ($t_2$–$t_3$) period:

In this state, the voltage $\Phi_{V1}$ turns to a top high level which is higher than usual transfer pulse, and through the capacitance 104 (FIG. 1) the voltage makes the gate of the SIT type phototransistor 101 open, and therefore, electrons of m-times the number of holes generated by the incident light moves to n-region 203 of the vertical BCCD 106.

In ($t_3$–$t_4$) period:

The voltage $\Phi_{V1}$ goes to low level and the gate of the SIT type phototransistor 101 is closed, thereby finishing pixel multiply-reading operation.

In ($t_4$–$t_5$) period:

In this period, the voltage $\Phi_S$ is at high level, and the potential of the n+-region 201 shifts from $\phi_3$ to $\phi_6$. From the instant of this shift, the energy band structure turns from the hitherto state of pixel charge multiply-reading to a state where charge transfer is possible (FIG. 2(e)).

In ($t_5$–$t_6$) period:

In this period, the voltage $\Phi_{V2}$ becomes to high level, and the signal charge of n-region 203 of $\phi_4$ voltage is transferred to n-region 204 of $\phi_5$ voltage.

In ($t_6$–$t_7$) period:

The voltage $\Phi_{V2}$ turns to low level, and n-region 204 becomes from $\phi_5$ voltage to $\phi_4$ voltage. And the signal charge transferred to n-region 204 stays there as they are.

In ($t_7$–$t_8$) period:

In this period, voltage $\Phi_{V1}$ becomes high level, and signal voltage of the n-region 204 of the voltage $\phi_4$ is transferred to the n-region 208 of voltage $\phi_5$.

In ($t_8$–$t_9$) period:

In this period, the voltage $\Phi_{V1}$ becomes low level, and the voltage of the n-region 208 changes from $\phi_5$ to $\phi_4$. The signal charge transferred to the n-region 208 is retained there as they are.

In ($t_9$–$t_{10}$) period:

In this period, driving pulse $\Phi_{H1}$ and $\Phi_{H2}$ for horizontal scanning of the horizontal BCCD 107 are impressed, and the signal charges transferred from the vertical BCCD 106 to horizontal BCCD 107 are transformed into a time-sequential electric signal by means of the charge detector 108.

And, now one horizontal scanning is completed, and thereafter, the above-mentioned steps from $t_5$ to $t_{10}$ are repeated for predetermined times, and a vertical scanning for one field is completed.

Then, the process enters into a second field, wherein the steps of from $t_1$ to $t_4$ are controlled by pulses of $\Phi_{V2}$ signal, and thereafter the steps from $t_5$–$t_{10}$ are repeated, and the second field scanning is completed.

Practical Example

Figure 2F:
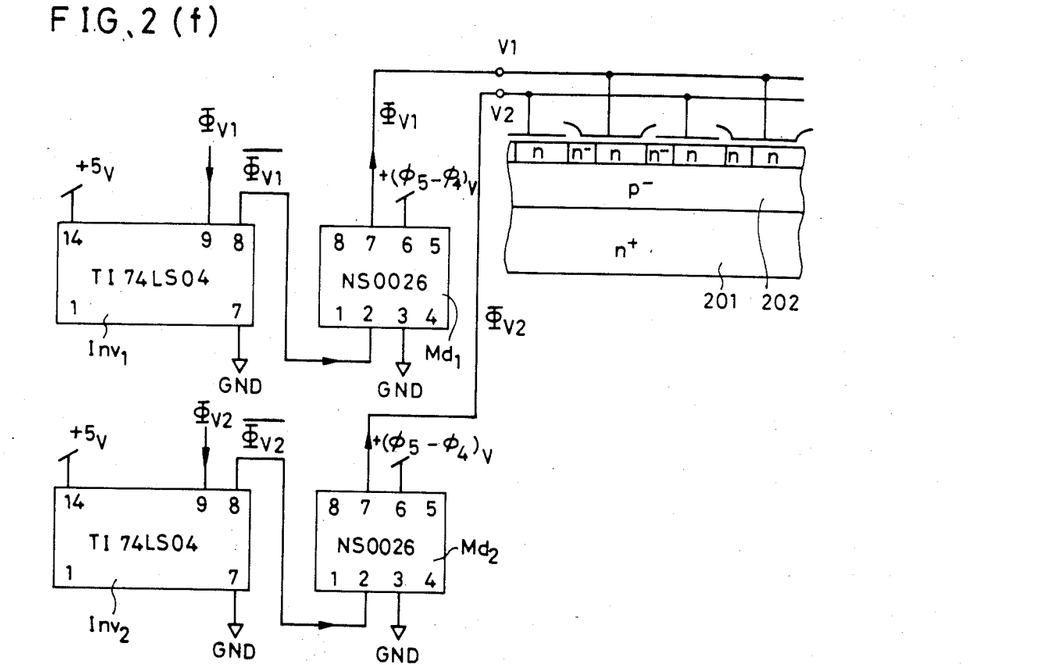
FIG. 2(f) is a concrete circuit diagram of a preferred embodiment for actual driving for vertical transfer of the CCD circuit, with the cross-sectional view of the solid state image sensor on an Y-Z section.
Figure 2G:
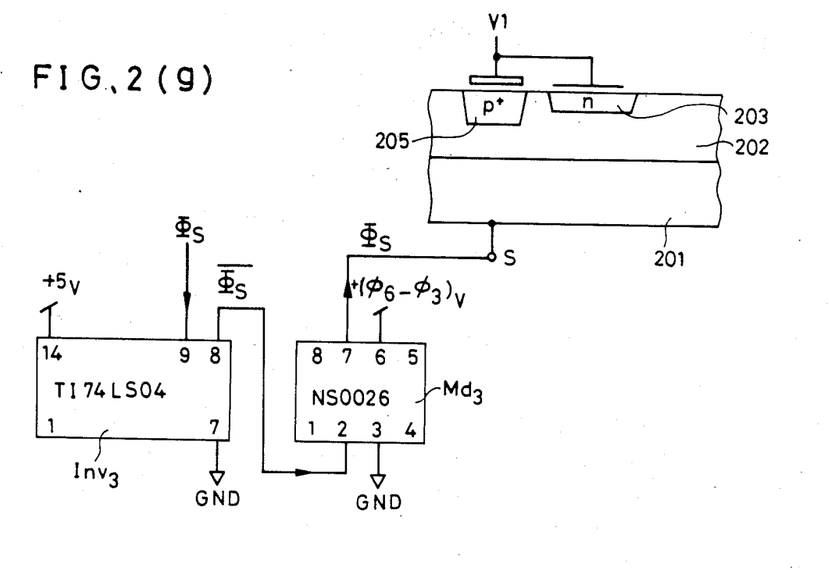
FIG. 2(g) is a circuit block diagram of a preferred embodiment for driving the voltage of the substrate 20 by impressing pulse signal through a terminal S for reading out and transfer of charge, with cross-sectional view of the Q part on an X-Z section.
Figure 3:
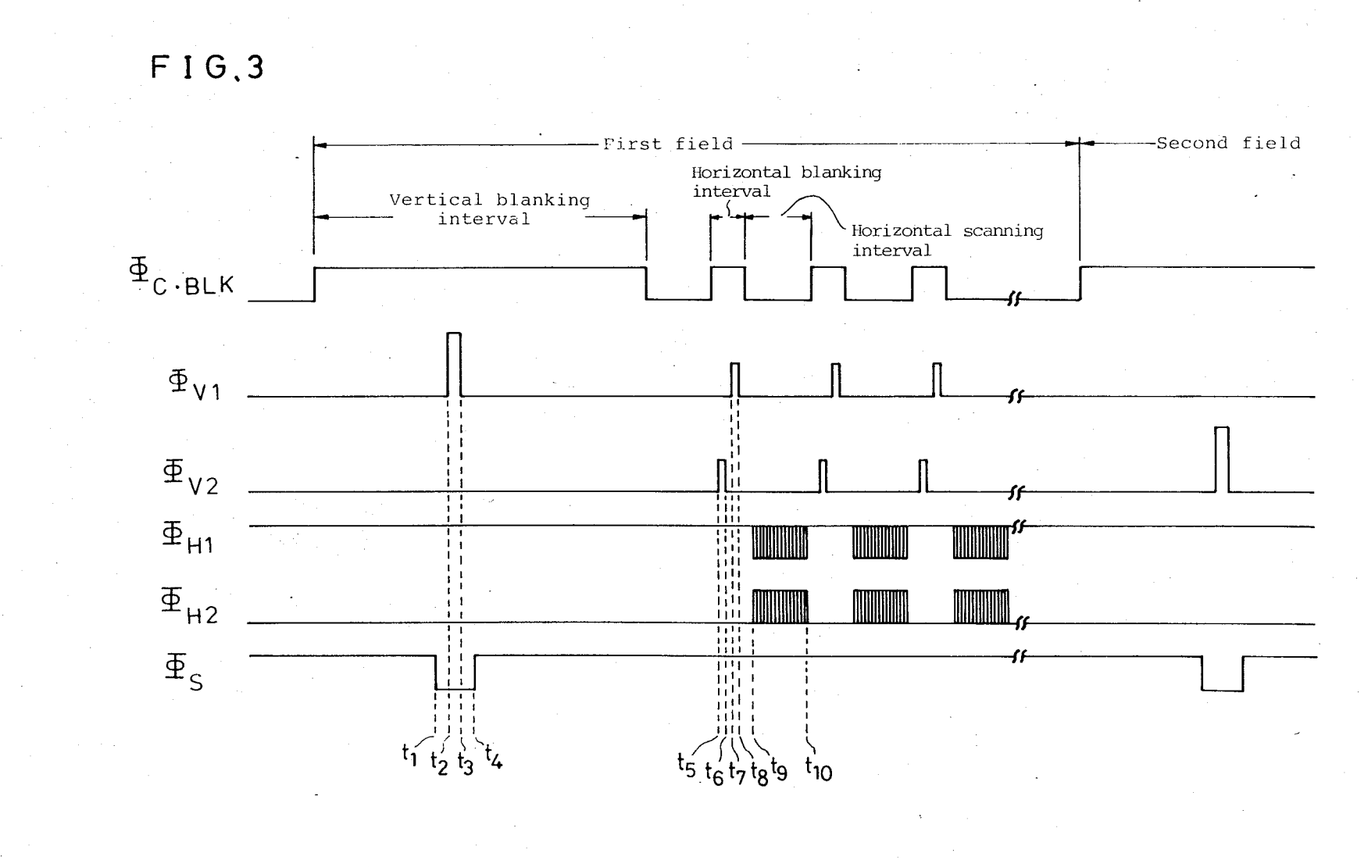
FIG. 3 is a timing chart of pulse signals to be applied on the embodiment apparatus shown in FIG. 1, FIG. 2(a), FIG. 2(b), FIG. 2(c), FIG. 2(d), FIG. 2(e), FIG. 2(f) and FIG. 2(g).

FIG. 2(f) and FIG. 2(g) show practical example. Taking, for example, the vertical transfer pulse, in actual circuit, the pulse signals $\Phi_{V1}$ and $\Phi_{V2}$ of FIG. 3 consisting of 5 V pulses are impressed in inverters Inv$_1$ and Inv$_2$ (for instance, TI74LS04 of Texas Instrument Corporation), and their output pulse signal is inputted to MOS drivers Md$_1$ and Md$_2$ (for instance, NS0026 of National Semiconductor Inc.), and the latter's output pulse $\Phi_{V1}$ and $\Phi_{V2}$ amplified to desired level for ($\phi_5$–$\phi_4$)$_V$ are impressed on the transfer electrodes V$_1$ and V$_2$ of the apparatus.

Figure 6:
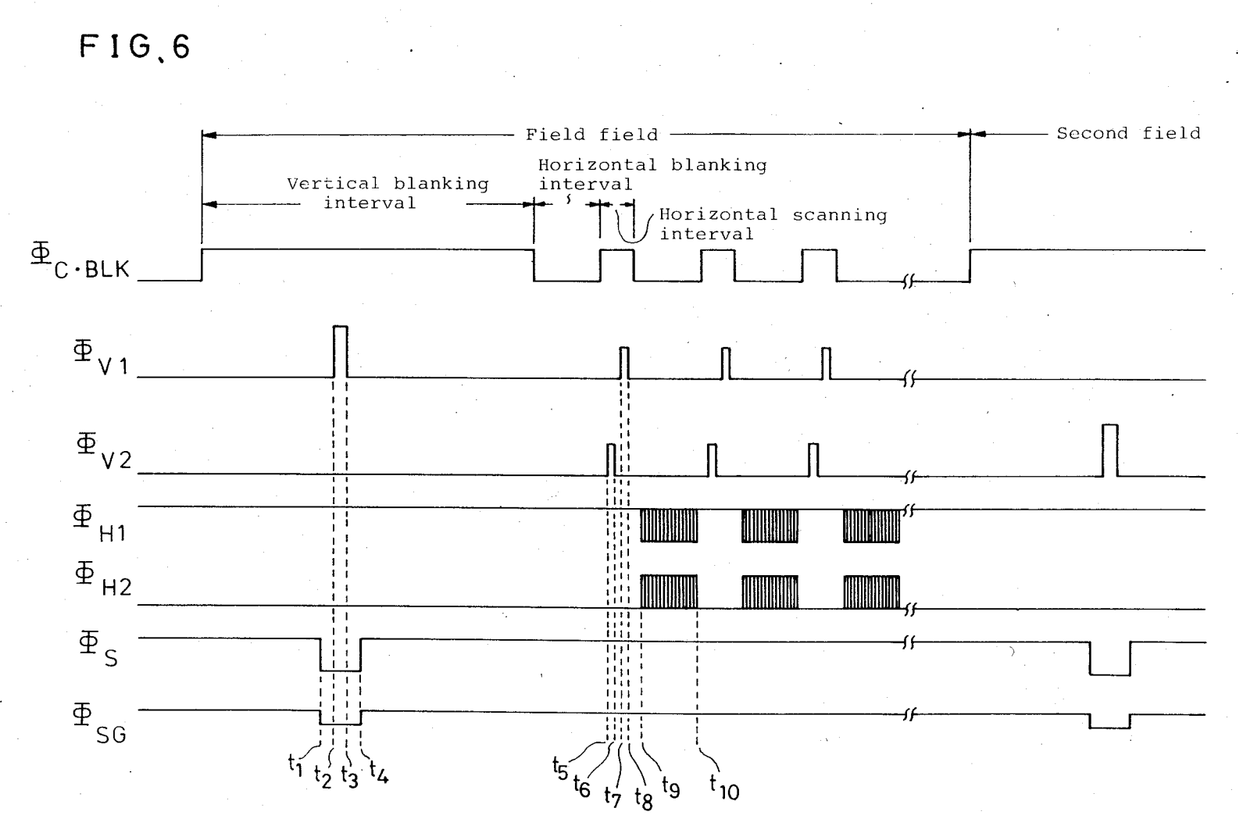
FIG. 6 is a timing chart of pulse signals to be applied on shown in FIG. 4, FIG. 5(a), FIG. 5(b), FIG. 5(c), FIG. 5(d), FIG. 5(e) and FIG. 5(f).

The signal to be impressed on the electrode S connected to the n+-substrate 201 is, for instance, given through a signal circuit comprising an inverter Inv$_3$ and a MOS driver Md$_3$. The inverter is, for instance, the TI74LS04 and the MOS driver is, for instance, the NS0026 and the signal $\Phi_S$ of FIG. 6 is inputted to the inverter Inv$_2$.

Since the circuit of the preferred embodiment utilizes multiplication of pixel charge signal, the sensitivity is improved. That is, as a result of the multiplication of the pixel signal, the signal charge only is multiplied without changing shot noise of the incident light. Accordingly, the image sensor in accordance with the present invention can suppress lowering of S/N ratio attributable to shot noise in principle even in a low brightness scene.

Second embodiment of the invention capable of extending dynamic range by controlling $\gamma$-characteristic is described with reference to FIG. 4 and thereafter.

A second embodiment of the present invention is described with reference to FIG. 4, FIG. 5(a), FIG. 5(b), FIG. 5(c), FIG. 5(d), FIG. 5(e), FIG. 5(f) and FIG. 6.

Figure 4:
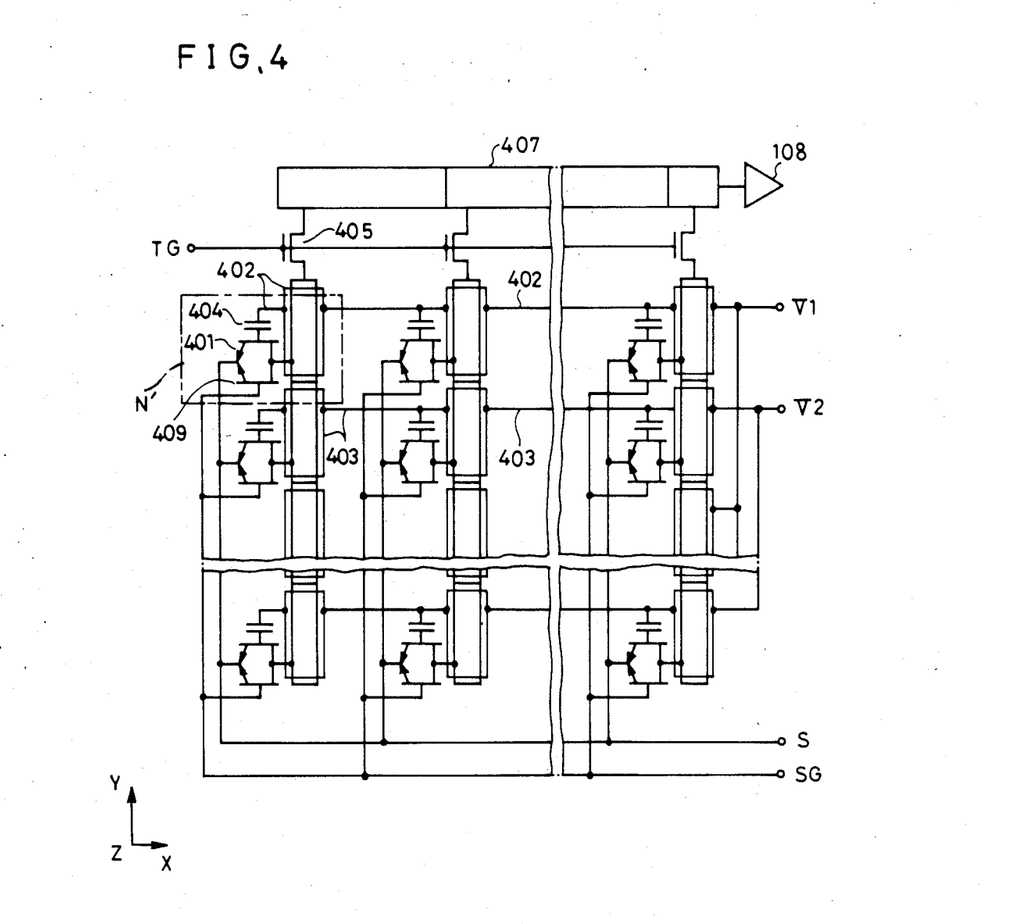
FIG. 4 is a schematic plan view of another solid state image sensor embodying the present invention.

As shown in FIG. 4, the solid state image sensor of the second embodiment comprises on a semiconductor substrate 501, an SIT type phototransistors 401 and 409 which are connected by their sources and drains in common, transfer gates 402 and a gate electrode V1 which are to be impressed with vertical scanning pulse $\Phi_{V1}$, transfer gates 403 and a gate electrode V2 which are to be impressed with another vertical scanning pulse $\Phi_{V2}$, coupling capacitors 404 for impressing vertical scanning pulses to gates of the SIT type phototransistors 401, source electrodes S for impressing voltage to sources of SIT type phototransistors 401 in common, a gate electrodes SG for impressing voltages to the gates of SIT type phototransistors 409, vertical horizontal transducing gates 405 for coupling with vertical BCCD 406 and horizontal BCCD 407, a gate electrode TG, and a charge detector 408.

Figure 5A:
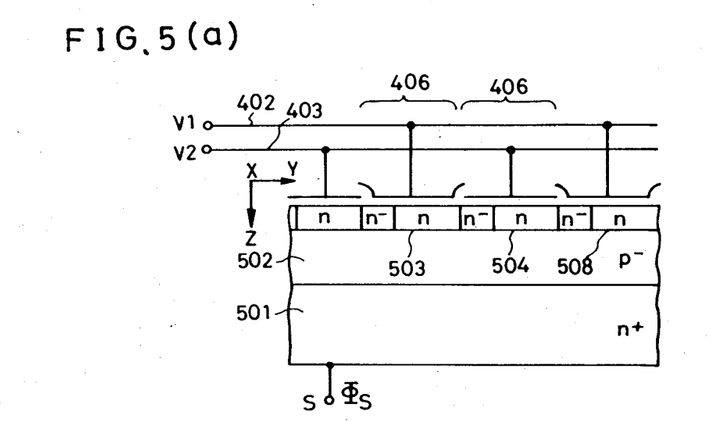
FIG. 5(a) is a sectional elevation view showing a cross-section of a part Q circled by chain lines in FIG. 4, and on k-k' section of FIG. 5(b).
Figure 5B:
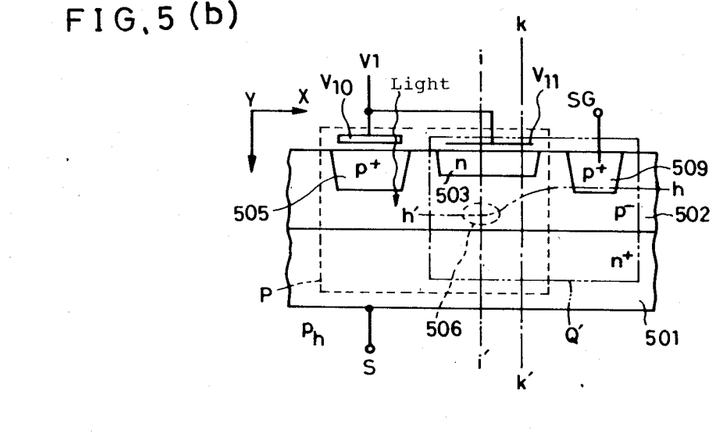
FIG. 5(b) is a cross-sectional view on an X-Z section at multiply-reading of a pixel information.
Figure 5C:
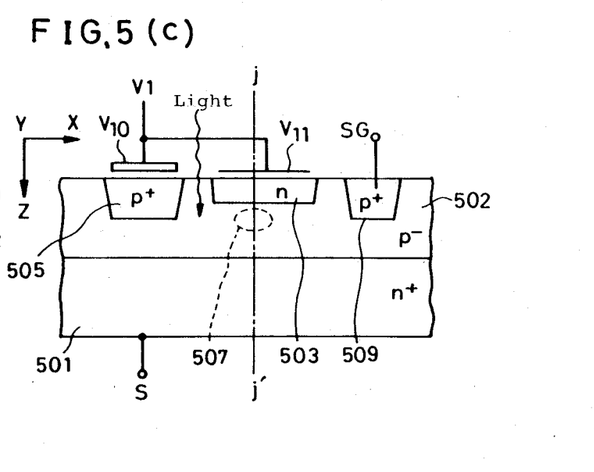
FIG. 5(c) is a cross-sectional view on an X-Z section at charge-transferring of a pixel information.

The part for one pixel encircled by chain lines N' has sectional configuration as shown by FIG. 5(a), FIG. 5(b) and FIG. 5(c) which are cross-sectional view by a Y-Z plane, an X-Z plane and an X-Z plane with respect to the directions shown in FIG. 4. In FIG. 5(a) to FIG. 5(f), left end corresponds to the substrate 501 and right end to the surface part of the vertical BCCD 406.

As shown in FIG. 4, FIG. 5(a), FIG. 5(b) and FIG. 5(c), the solid state image sensor is made by forming an epitaxial layer 502 of a low impurity concentration by known method. The conductivity of this epitaxial layer is e.g. p−-type, but may be n− or i. And therein, a p+-region 505 which serves as gate parts of the phototransistors 401 are formed, and further, n-regions 503 to serve as charge storing parts of the vertical BCCD 406 and also serves as drain parts of the phototransistor 401 are formed. Further, the p+-region 505 to serve as gate part, n-region 503 to serve as drain part and n+-substrate 501 to serve as source parts are formed. And these parts encircled in chain line block P form the first phototransistors 401. In the same manner, p+-region 509 to serve as pixel isolation region and as gate part of the phototransistor 409, n-region 503 to serve as drain part of the phototransistor 409, p⁻-epitaxial region 502, n⁺-substrate 501 which also serves as source parts of the phototransistor 409 are formed, and these parts encircled in a chain line block Q form the second phototransistor 409. A transparent electrode $V_{10}$ is provided over the p⁺-region 505 in electrically floating relation therefrom. A non-transparent electrode $V_{11}$ is provided over the n-region 503 in electrically floating relation therefrom. Both the transparent electrode $V_{10}$ and the non-transparent electrode $V_{11}$ in a phototransistor ph are connected to one of the electrode $V_1$, and the transparent electrode $V_{10}$ and the non-transparent electrode $V_{11}$ in the next phototransistor (not shown in FIG. 2(a) or FIG. 2(b)) are connected to the other of the electrode $V_2$. Thus the electrodes $V_1$ and $V_2$ are alternately connected to the electrodes $V_{10}$ and $V_{11}$ in every two phototransistors ph.

By impressing pulse voltage on the electrode S which is connected to the n⁺-conductivity substrate 201, the pixel multiply-reading operation, which implies reading out of signal charge from the photoelectric transducing part to the vertical BCCD 406, can be isolated from vertical and horizontal charge transferring operation. The n-region 503 and the pixel isolation region 509 are of course shielded from one light incident to the phototransistor part ph.

Since the operation of pixel charge multiply-reading can be instantly isolated by impression of the control pulse, the solid state image sensor in accordance with the present invention is named as charge amplified device in reading moment (abbreviated as CARM) to symbolize the function of the solid state apparatus of the present invention which realizes pixel charge multiply function at the instant of reading out the signal charge from the photoelectric transducer to vertical BCCD.

Figure 5D:
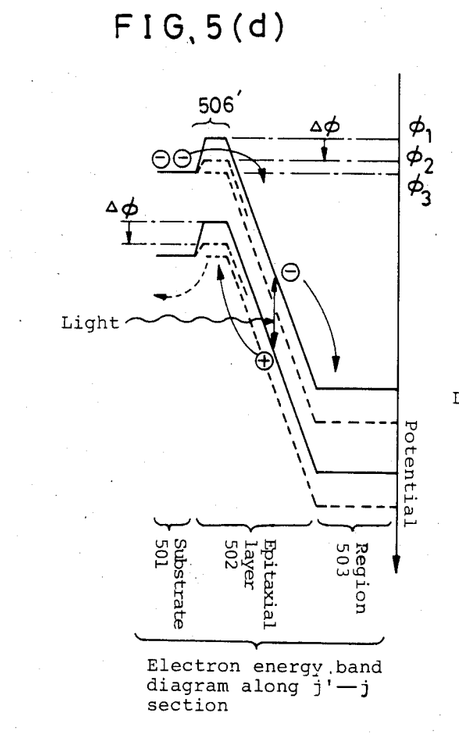
FIG. 5(d) and FIG. 5(e) are energy-band diagrams corresponding to the operation of FIG. 4(b) and FIG. 4(c), respectively.
Figure 5E:
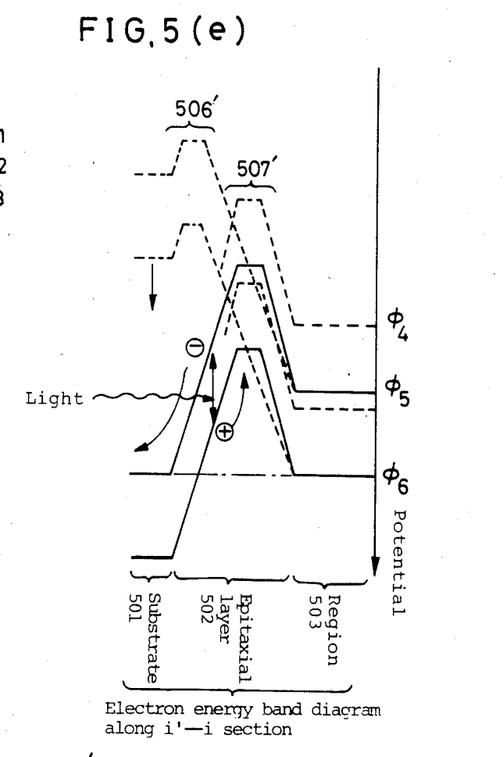

Herafter, configuration and principle of the operation is described with reference to FIG. 4 to FIG. 5(e).

(1). Pixel multiplying reading:

When electrode S connected to the n⁺-substrate 501 is grounded. (i) When there is no incident light, as shown in FIG. 5(b), a potential barrier region 506 of a saddle type which is a special feature of SIT, is formed on i–i' line, and a potential barrier 506' is formed as shown in FIG. 5(d). (ii) When there is incident light, in the p⁻-epitaxial region 202, electron and hole pairs are produced, and the electrons are transferred to the n-region 503 in the vertical BCCD, and the holes move to the p⁺-region 505. The holes stored in the p⁺-region 505 raises the potential of the p⁺-region 505 by $\Delta\phi$, and thereby the potential barrier against the electrons are increased by $\Delta\phi$. Therefore, a high level part of the vertical transferred pulse $\Phi_{V1}$ is boosted by this $\Delta\phi$ when impressed on the p⁺-region 505 which is the gate of the phototransistor ph. Thereby, electrons are injected from the n⁺-substrate 501 through p⁻-epitaxial region 502 to the n-region 503 corresponding to the rise by the extent of $\Delta\phi$. Since the holes stored in the p⁺-region 505 is kept as they are, when the potential $\Phi_{V1}$ is below a predetermined level, a non-destructive reading of the positive holes can be made. On the contrary, if the voltage $\Phi_{V1}$ is higher than the predetermined level, the positve holes stored in the p⁺-region 505 is put out to the n⁺-substrate 501, and in this case the reading is a usual destructive reading. In both cases of the non-destructive reading and the destructive reading, the number of electrons to be injected from the n⁺-substrate 501 to the n-region 503 in the vertical BCCD 406 can be multiplied by the holes stored in the p⁺-region 505. Such multiplying can be made by selecting the capacitance Cp of the p⁺-region 505 and capacitance Cn of the n⁺-substrate 501 to be Cn/Cp=m.

(2). Charge transfer operation:

When a voltage E is impressed on the electrode S connected to the n⁺-substrate 501. (i) When there is no incident light, as shown in FIG. 5(c) a potential barrier region 507 of a saddle type which is a special feature of SIT is formed on j–j' line, and a potential barrier 507' is formed as shown in FIG. 5(e). The potential barrier 507' is formed closer to the n-region 503 of the vertical BCCD 406 in comparison with the potential barrier 506. (ii) Accordingly, even when light comes on to phototransistor 401, among the electron and hole pairs produced in the p⁻-epitaxial region 502, the electrons move to the n⁺-region 501, and the holes move to p⁺-region 505. Then, the holes stored in the p⁺-region 505 deeper the potential barrier 507' by $\Delta\phi'$, but the holes are only kept stored in the p⁺-region 505, isolated from the transfer operation of the vertical BCCD 406 until commensing of pixel multiply-reading operation.

Figure 5F:
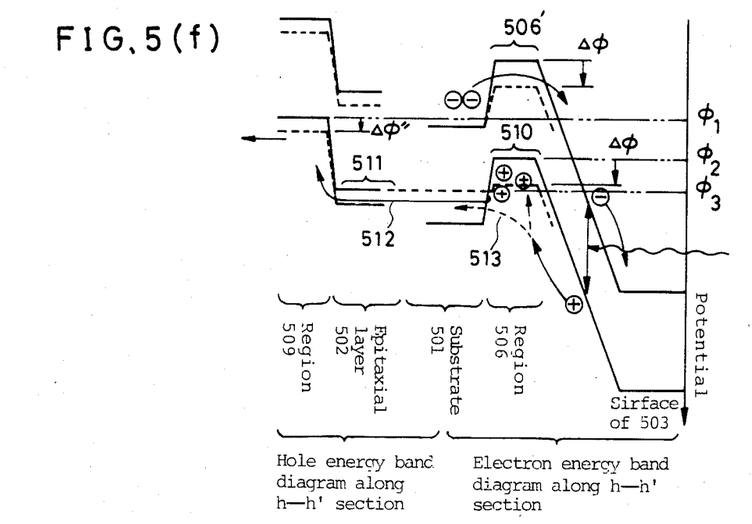
FIG. 5(f) is an energy-band diagram showing the operation of γ-controlling.

(3). γ-value control operation:

In this embodiment, γ-controlling can be made by controlling the potential of the p⁺-regions 509 which are pixel isolating regions. FIG. 5(f) is a chart showing relation between p⁺-region 509 and potentials impressed at the pixel amplify-reading operation. (i) When light is incident, electron and hole pairs are produced in the p⁻-epitaxial layer 502, and the electrons move to n-region 503 of the vertical BCCD, and the holes move to p⁺-region 505. Then, the holes stored in the p⁺-region 505 increases potential of the p⁺-region 505 by $\Delta\phi$, and as a result the potential barrier against electrons increases by $\Delta\phi$. At that time, when a relation is Cn/Cp=m for the capacitance Cp of the p⁺-region 505 and the capacitance Cn for the n⁺-substrate 501, the above-mentioned multiply-reading of the pixel such that electrons of a number as much as m-times of the number of holes stored in the p⁺-region 505 is injected to the n-region 503 is carried out.

At that time, by impressing a voltage E' from a voltage source having a high internal resistance on the electrode SG connected to the p⁺-region 509, in the p⁻-epitaxial region 502 a potential barrier 511 against the positive holes is formed, as shown in FIG. 5(f), between a potential $\phi_1$ for the holes in the p⁺-region 509 and a potential $\phi_2$ of a potential well 510 for the holes (the potential well 510 against the holes corresponds to the potential barrier 506 against the electrons). The potential of the potential barrier 511 is $\phi_3$. Accordingly, as the holes are stored in the potential well 510, the potential of the potential well 510 rises, and when the potential reaches $\phi_3$, the holes overflow to the p⁺-region 509 as shown by arrow 512 in FIG. 5(f) or some part of the holes generated by the electron-hole-pair generation moves to the p⁺-region 509 as shown by the arrow 513 in FIG. 5(f). Furthermore, since the electrode SG is impressed with a voltage through a power source with a high internal resistance, when the holes move to the p⁺-region 509, the potential $\Delta\phi''$ increases, and at the same time, the potential of the potential barrier 511 also increases by $\Delta\phi''$, and therefore, limitation of maximum charge storing amount of the potential well 510 is prevented. Accordingly, by selecting the value of $\Delta\phi''/\Delta\phi$ appropriate value, the γ-value can be selected $\gamma<1$. Thus, even when the maximum charge transfer amount in the vertical BCCD is left as it is, since setting of multiplication ratio for low brightness state to be smaller than multiplication ratio for high brightness state can be realized, handling of signal charge for a relatively wide dynamic range is possible. Furthermore, since in the transfer operation the potential barrier 506 changes to the potential barrier 507, by impressing a voltage corresponding to that difference onto the p+-region 509, the same stable operation is obtainable.

(4). Sequence of operation:

In ($t_1$-$t_2$) period:

In this period, the voltage $\Phi_S$ being impressed on the electrode S connected to the n+-substrate 501 becomes to low level, and the potential of n+-substrate 501 of FIG. 5(d) shifts to $\phi_3$. From that instant, a state of energy band structure of FIG. 5(d) wherein pixel multiply-reading becomes possible is formed. In this case, the potential barrier 506 shifts from the potential $\phi_1$ at non-illuminated state to the potential $\phi_2$ at illuminated state by an increase of $\Delta\phi$. At this moment the $\Phi_{SG}$ changes to a low level and an energy band shown by FIG. 5(f) is realized, thereby enabling $\gamma$-control operation.

In ($t_2$-$t_3$) period:

In this state, the voltage $\Phi_{V1}$ turns to a top high level which is higher than usual transfer pulse, and through the capacitance 404 (FIG. 1) the voltage makes the gate of the SIT type phototransistor 401 open, and therefore, electrons of m-times number of positve holes generated by the incident light moves to n-region 503 of the vertical BCCD 406.

In ($t_3$-$t_4$) period:

The voltage $v_1$ goes to low level and the gate of the SIT type phototransistor 401 is closed, thereby finishing pixel multiply-reading operation.

In ($t_4$-$t_5$) period:

In this period, the voltage $\Phi_S$ is at high level, and the potential of the n+-region 501 shifts from $\phi_3$ to $\phi_6$. From the instant of this shift, the energy band structure turns from the hitherto state of pixel charge multiply-reading to a state where charge transfer is possible (FIG. 5(e)). At the same time, the voltage $\Phi_{SG}$ turns to a high level, and the $\gamma$-controlling can be continued.

In ($t_5$-$t_6$) period:

In this period, the voltage $\Phi_{V2}$ becomes to high level, and the signal charge of n-region 503 of $\phi_4$ voltage is transferred to n-region 504 of $\phi_5$ voltage.

In ($t_6$-$t_7$) period:

The voltage $\Phi_{V2}$ turns to low level, and n-region 503 becomes from $\phi_5$ voltage to $\phi_4$ voltage. And the signal charge transferred to n-region 504 stays there as they are.

In ($t_7$-$t_8$) period:

In this period, voltage $\Phi_{V1}$ becomes high level, and signal voltage of the n-region 504 of the voltage $\phi_4$ is transferred to the n-region 508 of voltage $\phi_5$.

In ($t_8$-$t_9$) period:

In this period, the voltage $\Phi_{V1}$ becomes low level, and the voltage of the n-region 508 changes from $\phi_5$ to $\phi_4$. The signal charge transferred to the n-region 508 is retained there as they are.

In ($t_9$-$t_{10}$) period:

In this period, driving pulse $\Phi_{H1}$ and $\Phi_{H2}$ for horizontal scanning of the horizontal BCCD 407 are impressed, and the signal charges transferred from the horizontal BCCD 406 to horizontal BCCD 407 are transformed into a time-sequential electric signal by means of the charge detector 408.

And, now one horizontal scanning is completed, and thereafter, the above-mentioned steps from $t_5$ to $t_{10}$ are repeated for predetermined times, and a vertical scanning for one field is completed.

Then, the process enters into a second field, wherein the steps of from $t_1$ to $t_4$ are controlled by pulses of $\phi_{V2}$ signal, and thereafter the steps from $t_5$-$t_{10}$ are repeated, and the second field scanning is completed.

Practical Example or actual circuit of the second embodiment can use the similar driving circuit as has been shown in FIG. 2(f) and FIG. 2(g) show practical example. Therefore, superposed description on such circuit is omitted here for simplicity.

Since the second embodiment circuit utilizes multiplying of pixel charge signal, the sensitivity is improved. That is, as a result of the multiplying of the pixel signal the signal charge only is multiplied without changing shot noise of the incident light. Accordingly, the image sensor in accordance with the present invention can suppress lowering of S/N ratio attributable to shot noise in principle even in a low brightness scene. Besides, this second embodiment has a high multiplying ratio at low brightness and a low multiplying ratio at high brightness, and therefore the dynamic range is relatively extended through controlling of $\gamma$-characteristic to be $\gamma<1$.

The image sensor of the present invention can be realized by replacing the vertical BCCD's by SCCD's (surface CCD's), since the SCCD can also realize the same potential distributions as shown by FIG. 2(d), FIG. 2(e), FIG. 5(d) and FIG. 5(e).

Furthermore, the image sensor of the present invention can be realized by using BBD's in place of the CCD's, since the BBD's can make the similar function as that of the CCD's.

The solid state image sensor in accordance with the present invention can make (1) either non-destructive reading or destructive reading by simple switching of transfer voltage of the vertical CCD, by making a novel device of a rather simple combination of phototransistors and CCD's, (2) high sensitivity image sensing by adopting pixel multiplying, hence suppressing production of shot noise due to electron-hole pairs produced by incident light and is advantageous in high integration, (3) smear characteristic is relatively improved by the pixel multiplying and (4) $\gamma$-control operation is possible, thereby equivalently a large dynamic range characteristic is realizable by selecting $\gamma<1$, thereby giving a bright usage on the CCD type solid state image sensors. Since the non-destructive reading is possible, the solid state image sensor of the present invention can be used in a wide purposes other than TV camera, and the utility is great.

What is claimed is:

1. A solid state image sensor comprising:
   a semiconductor substrate having a high impurity concentration of a first conductivity type,
   an epitaxial layer of a low impurity concentration formed on said substrate,
   a plurality of first regions of high impurity concentration of a second conductivity type formed in a two-dimensional disposition on said epitaxial layer and electrically in a floating state,
   said epitaxial layer and said first regions forming photo-electric converting region,
   plural charge transfer means for transferring first-type charges along a row direction of said first regions,
   said charge transfer means including second regions of said first conductivity type and a transfer electrode on an insulating layer which is disposed on said second regions, and being formed corresponding to respective rows of said first regions and electrically in a floating state, said second regions being depleted and used as a charge transfer channel, a charge multiplication means for producing said first-type charges multiplied in proportion to second-type charges generated in said photo-electric converting region by incident light and accumulated in said first regions, said charge multiplication means including said substrate, said epitaxial layer, said first regions and said second regions which form static induction transistors, and voltage controlling means for controllably generating a voltage between said substrate and said first regions, said voltage controlling means establishing a controllable potential barrier with respect to said first-type charges in said substrate for cutting off said static induction transistor when said first-type charges are transferred in said charge transfer region.

2. A solid state image sensor in accordance with claim 1, wherein said voltage controlling means is for producing such voltage relation that when said voltage equals the contact-potential difference between said substrate and said first regions, said charge multiplication means operates and said charge transfer means stops operating, and when said voltage becomes inverted bias condition between said substrate and g said first regions, said charge multiplication means stops operating and said charge transfer means operates.

3. A solid state image sensor in accordance with claim 1 or 2, wherein said charge transfer regions which comprise fourth regions g of said second conductivity type, and surfaces of said fourth regions become an inversion layer.

4. A solid state image sensor in accordance with claim 1, which further comprises:

third regions of said second conductivity type which are connected to leading out electrode for taking out a part of said second-type charges generated by incident light, and said third g regions are formed corresponding to said first regions respectively.

5. A solid state image sensor in accordance with claim 4, wherein said voltage controlling means is for producing such voltage relation that when said voltage equals contact-potential difference between said substrate and said first regions, said charge multiplication means operates and said charge transfer means stops generating, and when said voltage becomes inverted bias condition between said substrate and said first regions, said charge multiplication means stops operating and said charge transfer means operates.

6. A solid state image sensor in accordance with claim 4 or 5, wherein said charge transfer regions which comprises fourth regions of said second conductivity type, and surface of said fourth regions become an inversion layer.

* * * * *